United States Patent
Lee et al.

(10) Patent No.: US 10,003,374 B1
(45) Date of Patent: Jun. 19, 2018

(54) WIRELESS RADIO FREQUENCY TRANSCEIVER SYSTEM FOR INTERNET OF THINGS

(71) Applicant: National Cheng Kung University, Tainan (TW)

(72) Inventors: Shuenn-Yuh Lee, Tainan (TW); Ching-Fu Tsou, Taipei (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days. days.

(21) Appl. No.: 15/826,536

(22) Filed: Nov. 29, 2017

(51) Int. Cl.
| | |
|---|---|
| *H04B 1/40* | (2015.01) |
| *H04B 1/16* | (2006.01) |
| *H03F 3/24* | (2006.01) |
| *H03F 1/22* | (2006.01) |
| *H03B 5/12* | (2006.01) |
| *H03F 3/62* | (2006.01) |
| *H03F 3/19* | (2006.01) |

(52) U.S. Cl.
CPC ............ *H04B 1/40* (2013.01); *H03B 5/1212* (2013.01); *H03F 1/223* (2013.01); *H03F 3/19* (2013.01); *H03F 3/245* (2013.01); *H03F 3/62* (2013.01); *H04B 1/16* (2013.01); *H03F 2200/06* (2013.01); *H03F 2200/102* (2013.01); *H03F 2200/168* (2013.01); *H03F 2200/411* (2013.01); *H03F 2200/451* (2013.01); *H03F 2200/555* (2013.01)

(58) Field of Classification Search
CPC .......... H04B 1/40; H04B 1/16; H03B 5/1212; H03F 21/223; H03F 3/19; H03F 3/245; H03F 3/62; H03F 2200/06; H03F 2000/102; H03F 2200/168; H03F 2200/411; H03F 2200/451; H03F 2200/555

See application file for complete search history.

(56) References Cited

U.S. PATENT DOCUMENTS

| | | | |
|---|---|---|---|
| 9,887,864 B1 * | 2/2018 | Han | H04W 4/70 |
| 2015/0229317 A1 * | 8/2015 | Juneau | H03L 7/18 327/105 |

(Continued)

*Primary Examiner* — Freshteh N Aghdam
(74) *Attorney, Agent, or Firm* — Chun-Ming Shih

(57) ABSTRACT

A wireless radio frequency transceiver system for Internet of Things includes: a wireless radio frequency transmission module and a wireless radio frequency receiving module. The wireless radio frequency transmission module is used to shape signal waveform of digital signals from the Internet of Things to modulate the digital signals to form modulated output signals, and adopt a self-mixing technique to increase voltage/current amplitude of the modulated output signals and reduce phase noise. The wireless radio frequency transmission module is further used to adopt a current reuse technique to amplify the voltage/current amplitude of the modulated output signals, and transmit the amplified modulated output signals through a first antenna to a wireless channel. The wireless radio frequency receiving module is used to detect carrier input signals received from a second antenna to obtain baseband signals and demodulate the baseband signals to form differential signals. The wireless radio frequency receiving module is further used to amplify voltage/current amplitude of the demodulated differential signals several times in an open loop state to produce digital output signals, and transmit the digital output signals to a back-end signal processor.

9 Claims, 13 Drawing Sheets

(56) References Cited

U.S. PATENT DOCUMENTS

| | | | | |
|---|---|---|---|---|
| 2016/0233908 A1* | 8/2016 | Mak | ................... | H03H 19/004 |
| 2017/0134197 A1* | 5/2017 | Kim | ..................... | H04L 27/04 |
| 2017/0201278 A1* | 7/2017 | Dehmas | ............. | H04B 1/1036 |
| 2017/0288932 A1* | 10/2017 | Kang | ................ | H04L 27/0014 |
| 2017/0367277 A1* | 12/2017 | Mohindra | ............ | A01G 22/00 |

* cited by examiner

United States Patent No. US 10,003,374 B1

WIRELESS RADIO FREQUENCY TRANSCEIVER SYSTEM FOR INTERNET OF THINGS

CROSS-REFERENCE TO RELATED APPLICATIONS

This application claims the priority of Republic of China Patent Application No. 106128190 filed on Aug. 18, 2017, in the State Intellectual Property Office of the R.O.C., the disclosure of which is incorporated herein by reference.

BACKGROUND OF THE INVENTION

Field of the Invention

The invention relates to wireless radio frequency transceiver technologies, and more particularly, to a wireless radio frequency transceiver system applicable to Internet of Things and having low power consumption.

Descriptions of the Related Art

Communication technologies through computers, Internet and so on have boomed, and then Internet of Things (JOT) has become popular recently in terms of its capability of connecting all objects to the Internet by means of signal transmitting or sensing equipment to achieve object recognition and intelligent management, wherein the signal transmitting or sensing equipment is, for example, wireless Radio Frequency Identification (RFID) system. This allows automatic recognition, information interconnection or information sharing to be achieved during procedures of production, logistics and sale of items to thereby accomplish convenient and efficient management.

Taking the wireless RFID system used in IOT as an example, an analog integrated circuit, a digital integrated circuit and a wireless radio frequency integrated circuit are often integrated in the same System on Chip (SOC) in response to continuing development of the integrated circuits, wherein the wireless radio frequency integrated circuit however usually takes up the entire system power consumption. Particularly, the wireless radio frequency integrated circuit includes a transmitter part and a receiver part, wherein the receiver part of such a conventional wireless radio frequency transceiver system has an architecture similar to Super-Heterodyne Receiver, Homodyne Receiver, Image-Reject Receiver, Low-IF Receiver and so on, which all utilize a coherent detection technique by means of a high-power mixer and a high-power local oscillator to perform signal demodulation. This dramatically increases power consumption of the wireless radio frequency transceiver system and shortens its use time.

Moreover, the transmitter part of the wireless radio frequency transceiver system usually has higher power consumption than the receiver part, which means the transmitter part takes up the highest power consumption portion of the entire SOC. The transmitter part of the existing wireless radio frequency transceiver system has an architecture similar to Dual Up-Conversion Transmitter, Direct Up-Conversion Transmitter, PLL-Based Transmitter, Low-IF Transmitter and so on, which also utilize a coherent detection technique by means of a high-power mixer and a high-power local oscillator to perform signal demodulation. This also dramatically increases power consumption of the wireless radio frequency transceiver system and shortens its use time.

The above receiver and transmitter architectures of the conventional wireless radio frequency transceiver system are primarily used for long distance transmission and large amount data transmission. Long distance transmission makes the system require high sensitivity specifications, and large amount data transmission makes the system require high bit rate and multi-channel circuit specifications. These both cause the system to have high power consumption. However in an IOT application environment, the wireless radio frequency transceiver system should have a lot of nodes and long-term use characteristics, and thus its receiver and transmitter architectures must have low power consumption, low area and low cost in order to perform short distance data transmission. The conventional wireless radio frequency transceiver system thereby is apparently not applicable to IOT.

Therefore, how to work out a wireless radio frequency integrated circuit especially through internal circuit innovation and improvement to greatly enhance system sensitivity and bit rate and thus create a wireless radio frequency transceiver system applicable to IOT, is an important task in the art.

SUMMARY OF THE INVENTION

In view of the above drawbacks in the prior art, a primary object of the invention is to provide a wireless radio frequency transceiver system architecture and an internal circuit component architecture, which are applicable to IOT. This wireless radio frequency transceiver system has characteristics of low power consumption, low number of circuit components, low area, low complexity, high degree of integration and resistance to carrier frequency offset, thereby conforming to the requirement of a large number of nodes for IOT and solving the above problem of a convention communication architecture not applicable to IOT.

For the objects said above and for other objects, the invention provides a wireless radio frequency transceiver system for Internet of Things, including: a wireless radio frequency transmission module including: a pre-emphasis signal generator for shaping signal waveform of digital signals from the Internet of Things to modulate the digital signals to form modulated output signals; a current-reused self-mixing voltage-controlled oscillator for increasing voltage/current amplitude of the modulated output signals and reducing phase noise via a self-mixing technique; and a current-reused multiple-transconductance power amplifier for amplifying the voltage/current amplitude of the modulated output signals via a current reuse technique, and transmitting the amplified modulated output signals through a first antenna to a wireless channel; and a wireless radio frequency receiving module including: a balun self-biasing gain-bandwidth-improved envelope detector for detecting carrier input signals received from a second antenna to obtain baseband signals and demodulating the baseband signals to form differential signals; and a current-reused cascode-two-stage amplifier for amplifying voltage/current amplitude of the demodulated differential signals several times in an open loop state to produce output signals, and transmitting the output signals to a back-end signal processor.

Optionally, the wireless radio frequency receiving module further includes a tunable high-pass filter for filtering off low frequency noise from the demodulated differential signals.

Optionally, the wireless radio frequency receiving module further includes a comparator for detecting the output signals amplified by the current-reused cascode-two-stage amplifier, converting the output signals into digital data, and transmitting the digital data to the signal processor where the digital data are processed and displayed.

Optionally, if the differential signals are analog signals, the output signals amplified by the current-reused cascode-two-stage amplifier are outputted directly.

In an embodiment of the present invention, the pre-emphasis signal generator includes a plurality of delay elements, a digital logic unit and a multiplexer, wherein the digital signals are dispersed into different signals by the plurality of delay elements, and the different signals are calculated by the digital logic unit and are processed by the multiplexer arranged with different voltage/current bias to form the modulated output signals with different voltage/current amplitude.

In an embodiment of the present invention, the current-reused self-mixing voltage-controlled oscillator includes a square law element, a DC coupled low frequency AC isolation unit, a complementary cross mixing unit and an inductance capacitance resonance unit, wherein the square law element performs frequency multiplication on the modulated output signals, the DC coupled low frequency AC isolation unit filters the modulated output signals that have been subjected to frequency multiplication to remove low frequency noise therefrom, and the complementary cross mixing unit mixes the filtered modulated output signals to down-convert them to a resonant frequency and sends them back to the inductance capacitance resonance unit, so as to enhance voltage/current amplitude of the modulated output signals through a positive feedback path.

In an embodiment of the present invention, the current-reused multiple-transconductance power amplifier includes a plurality of amplifiers, DC blocks, DC power supply units and signal summers, wherein the DC blocks and the DC power supply units provide a loop for AC signals, and the plurality of amplifiers amplify voltage/current amplitude of the modulated through the DC blocks to output signals and send them to an output end for signal summation of the output signals by the signal summers, so as to achieve an arbitrary multiple of transconductance gain and to produce a higher transconductance gain.

In an embodiment of the present invention, the balun self-biasing gain-bandwidth-improved envelope detector includes multi-frequency harmonic coupling units, low frequency blocks, tunable harmonic filter units and high impedance units, wherein the multi-frequency harmonic coupling units receive and process the carrier input signals to produce harmonic distortion signals, the low frequency blocks filter the harmonic distortion signals to remove low frequency noise interference and send the filtered harmonic distortion signals to the tunable harmonic filter unit, the tunable harmonic filter units filter out baseband signals from the filtered harmonic distortion signals, and the high impedance units enhance output impedance at an output end via an AC signal virtual grounding characteristic.

In an embodiment of the present invention, the current-reused cascode-two-stage amplifier includes a plurality of amplifiers and bidirectional amplifiers, wherein the plurality of amplifiers are crossly wired, the demodulated differential signals are amplified by the plurality of amplifiers and are sent to an output end, and the bidirectional amplifiers enhance amplitude of the output signals via a dual input signal reused characteristic.

Compared to the conventional technology, the wireless radio frequency transceiver system of the invention has a wireless radio frequency receiving module that utilizes a harmonic detection technique to perform demodulation. This can significant simplify complexity of the wireless radio frequency receiving module, reduce system power consumption and area, and thereby facilitate integration. Moreover, as the wireless radio frequency receiving module utilizes the harmonic detection technique, there is no need to use a phase-locked loop in a wireless radio frequency transmission module of the wireless radio frequency transceiver system, thereby desirably simplifying system design, reducing power consumption and area and facilitating integration.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
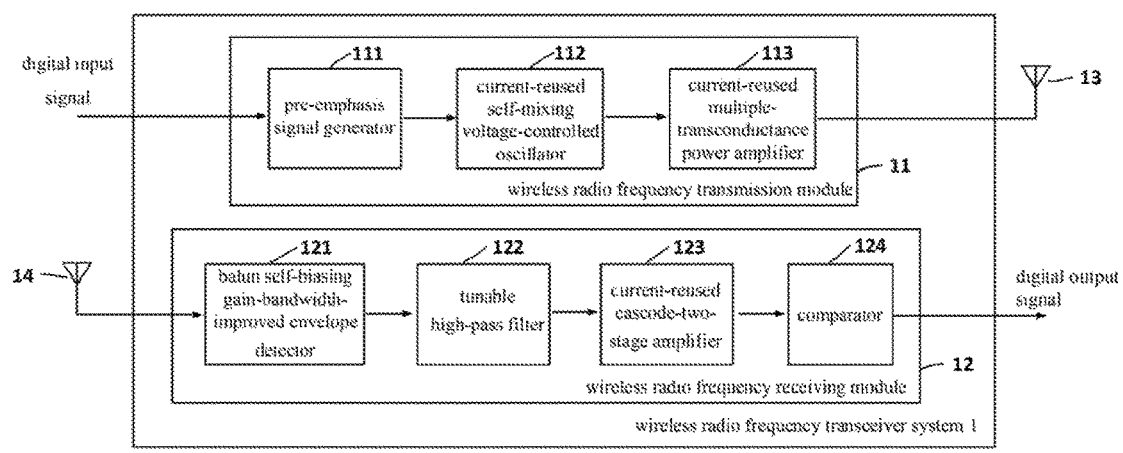
FIG. 1 is a system architecture diagram of a wireless radio frequency transceiver system of the invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Refer to FIG. 1, which is a system architecture diagram of a wireless radio frequency transceiver system of the invention. Generally, the wireless radio frequency transceiver system 1 of the invention is applicable to Internet of Things (TOT) and utilizes a harmonic detection technique to simplify its system circuit design, thereby reducing power consumption and area thereof and facilitating integration.

The wireless radio frequency transceiver system 1 includes a wireless radio frequency transmission module 11 situated at a transmission end thereof, and a wireless radio frequency receiving module 12 situated at a receiving end thereof.

The wireless radio frequency transmission module 11 includes a pre-emphasis signal generator 111, a current-reused self-mixing voltage-controlled oscillator 112, and a current-reused multiple-transconductance power amplifier 113. Generally, the pre-emphasis signal generator 111 is used to perform shaping of signal waveform on digital signals from the IOT, and modulate and output the digital signals as modulated output signals. The current-reused self-mixing voltage-controlled oscillator 112 utilizes a self-mixing technique to increase voltage/current amplitude of the modulated output signals and reduce phase noise. The current-reused multiple-transconductance power amplifier 113 utilizes a current reuse technique to amplify the voltage/current amplitude of the modulated output signals, and sends the modulated output signals after being amplified to a wireless channel through a first antenna 13.

In particular, the wireless radio frequency transmission module 11 has characteristics of low power consumption, low area, low cost, high degree of integration and easy accomplishment, etc., making it applicable to an IOT system. The wireless radio frequency transmission module 11 can modulate any input signal (such as digital signal or analog signal) in a manner of frequency up or down conversion. As shown in FIG. 1, when digital signals from the IOT enter the wireless radio frequency transmission module 11, they first undergo signal waveform shaping performed by the pre-emphasis signal generator 111 to form modulated output signals. The signal waveform shaping can be done in various ways to compensate possible shortcomings of different modulation methods such as OOK modulation, ASK modulation, FSK modulation, PSK modulation, QAM modulation, MSK modulation and so on. This not only solves a problem of slow amplitude change of OOK signals and ASK signals, but also speeds up stability of frequency modulation of FSK signals as well as solves a high-frequency interference problem of discontinuous PSK signals.

After being processed by the pre-emphasis signal generator 111, the digital signals have become the modulated output signals that are sent to the current-reused self-mixing voltage-controlled oscillator 112. The current-reused self-mixing voltage-controlled oscillator 112 utilizes the self-mixing technique while operates with lower power consumption, lower component area and lower cost to raise voltage/current amplitude of the modulated output signals and have lower phase noise and lower noise skin, thereby making the wireless radio frequency transmission module 11 less interference with other frequency bands.

Then, the modulated output signals from the current-reused self-mixing voltage-controlled oscillator 112 are sent to the current-reused multiple-transconductance power amplifier 113. The current-reused multiple-transconductance power amplifier 113 utilizes the current reuse technique, an amplifier cascode architecture and a DC block, etc. to form a power amplifier that can produce an arbitrary multiple of transconductance, so as to output higher output power to the first antenna 13 under lower power consumption, such that the use of the current-reused multiple-transconductance power amplifier 113 may achieve higher energy conversion benefits. Moreover, the amplifier cascode architecture can simply use a single bias current to accomplish even harmonic elimination function and common mode noise elimination function that usually are only possessed by a differential architecture. This improves linearity of the modulated output signals, reduces interference with neighbor channels, improves signal-to-noise ratio (SNR) of the wireless radio frequency receiving module 12, and reduces bit-error rate of the wireless radio frequency receiving module 12.

The wireless radio frequency receiving module 12 includes a balun self-biasing gain-bandwidth-improved envelope detector 121 and a current-reused cascode-two-stage amplifier 123. Generally, the balun self-biasing gain-bandwidth-improved envelope detector 121 is used to detect carrier input signals received from a second antenna 14 to obtain baseband signals, and modulate the baseband signals to form differential signals. The current-reused cascode-two-stage amplifier 123 is used to perform several times of amplification in an open loop state to amplify voltage/current amplitude of the modulated differential signals to form output signals, and send the output signals to a back-end signal processor.

Preferably, the wireless radio frequency receiving module 12 further includes a tunable high-pass filter 122, which can be mounted between the balun self-biasing gain-bandwidth-improved envelope detector 121 and the current-reused cascode-two-stage amplifier 123. The tunable high-pass filter 122 is used to filter off intermediate/low frequency noise.

Preferably, the wireless radio frequency receiving module 12 further includes a comparator 124 connected to and situated next to the current-reused cascode-two-stage amplifier 123. The comparator 124 is used to detect the output signals that have been amplified by the current-reused cascode-two-stage amplifier 123, convert the output signals into digital data, and send the digital data to the signal processor where the digital data would be processed and displayed. In another embodiment, if the differential signals are analog signals rather than digital signals, the output signals that have been amplified by the current-reused cascode-two-stage amplifier 123 can be outputted directly.

Particularly, the wireless radio frequency receiving module 12 has characteristics of low power consumption, low area, low cost, high degree of integration and easy accomplishment, etc., making it applicable to the IOT system. The wireless radio frequency receiving module 12 utilizing the harmonic detection technique does not need a phase-locked loop (PLL) in the transmission part of the wireless radio frequency transceiver system 1, thereby greatly reducing power consumption, area and cost of the wireless radio frequency transmission module 11, as well as improving integration of the wireless radio frequency transceiver system 1. The wireless radio frequency receiving module 12 can demodulate any amplitude-modulated signal, such as ASK signal, OOK signal or QAM signal. As shown in FIG. 1, the second antenna 14 receives the carrier input signals and sends them to the balun self-biasing gain-bandwidth-improved envelope detector 121 where baseband envelopes of the signals are detected and turned into differential signals for being outputted. As demodulated signals if changing directly to baseband are subjected to low frequency flicker noise interference, the differential signals after demodulation are sent to the tunable high-pass filter 122. The tunable high-pass filter 122 can have a tunable frequency band design in order to resist process offset.

Afterwards, the differential signals are sent to the current-reused cascode-two-stage amplifier 123 where several times of amplification are performed. This is because the demodulated signals do not have large amplitude, so an amplifier is needed. For the current-reused cascode-two-stage amplifier 123 of the invention, in the open loop state, a cascode amplifier has advantages of lower power consumption and better bandwidth, and a two-stage amplifier has advantages of better gain and larger output swing. Finally, the amplified demodulated differential signals are sent to the comparator 124. If the differential signals are digital signals, the comparator 124 converts them into digital data that can be outputted to a digital signal processor, mobile phone or computer to be processed and displayed. If the differential signals are analog signals, they can be directly outputted by the current-reused cascode-two-stage amplifier 123 without the use of the comparator 124.

Compared to a dual up-conversion transmitter, the wireless radio frequency transmission module 11 of the invention utilizes a direct up-conversion technique to modulate baseband signals, thereby having characteristics of low system complexity and low power consumption, and output signals therefrom can be modulated by OOK (on-off-keying) or FSK (frequency-shift-keying) method. If using OOK modulation, the wireless radio frequency transmission module 11 may have characteristics of low power consumption, low area, low cost, low complexity and high degree of integration. If using FSK modulation, the wireless radio frequency transmission module 11 may have characteristics of high data rate and low bit error rate.

The wireless radio frequency transmission module 11 of the invention utilizes the harmonic detection technique and thus can resist carrier frequency offset, such that PLL is not required in the wireless radio frequency transmission module 11. Further in the wireless radio frequency transceiver system 1, the wireless radio frequency transmission module 11 always has higher power consumption than the wireless radio frequency receiving module 12. No PLL needed can thus significantly reduce power consumption and area of the wireless radio frequency transmission module 11.

When the conventional wireless radio frequency transceiver system utilizes the direct up-conversion technique to process transmission, bias voltage/current of a voltage-controlled oscillator must be controlled in an amplitude-shift keying (ASK) procedure to control the voltage-controlled oscillator to output large/small amplitude so as to generate amplitude modulated signals. However, time for the outputted signal amplitude from the voltage-controlled oscillator to go up and down may limit or affect signal bit rate during transmission. This means that, if the time for the amplitude to go up and down is long after the voltage-controlled oscillator is subjected to the voltage/current control, the system bit rate is reduced; if the time for the amplitude to go up and down is short after the voltage-controlled oscillator is subjected to the voltage/current control, the system bit rate is raised. To solve the above problem, the current-reused self-mixing voltage-controlled oscillator 112 of the invention is provided at its front end with the pre-emphasis signal generator 111, so as to weight signal amplitude of voltage/current control signals that are originally to be inputted to the current-reused self-mixing voltage-controlled oscillator 112, and through the total weighting, generate stimulation signals with arbitrary waveform. The stimulation signals are inputted to the current-reused self-mixing voltage-controlled oscillator 112 to make up and down change of its amplitude subjected to stronger signal control to accelerate the up and down change, such that signal bit rate of the entire wireless radio frequency transmission module 11 can be greatly increased. In another embodiment, if the pre-emphasis signal generator 111 is implemented in the form of digital circuit, it merely consumes very low power, and thus the signal bit rate of the entire wireless radio frequency transmission module 11 would be raised with the power consumption being hardly increased.

As described above, the pre-emphasis signal generator 111 allows the signal bit rate of the entire wireless radio frequency transmission module 11 to be increased. For example, if using the OOK modulation method, the wireless radio frequency transmission module 11 has lower bit rate than using the ASK modulation method. It is because when sending OOK signal 0 (a modulation index of OOK modulation is 100%), the current-reused self-mixing voltage-controlled oscillator 112 is in a fully off state; while using the ASK modulation method, the current-reused self-mixing voltage-controlled oscillator 112 is not fully closed (off). When transmitting OOK modulated signals, every time to send out signal 1, it has to wait until the current-reused self-mixing voltage-controlled oscillator 112 restarts oscillating from the fully off state and then signal 1 can be sent out. That is, to completely transmit signal 0 and signal 1, every time it has to wait until the current-reused self-mixing voltage-controlled oscillator 112 restarts oscillating from the fully off state. This waiting time makes bit rate of the OOK modulated signals not able to increase. The pre-emphasis signal generator 111 of the invention may shorten the time required for the current-reused self-mixing voltage-controlled oscillator 112 to restart oscillating, and thus improves the bit rate of the OOK modulated signals, thereby making the OOK modulation method advantageously have low power consumption and effectively solve the problem of having low bit rate.

If the wireless radio frequency transmission module 11 of the invention uses the FSK (frequency-shift-keying) modulation method, the pre-emphasis signal generator 111 can change input signals and output tunable bias voltage/current of the current-reused self-mixing voltage-controlled oscillator 112, wherein through different ratio weighted control waveform, the current-reused self-mixing voltage-controlled oscillator 112 is stable and fast in a frequency modulation process so as to raise signal bit rate when transmitting FSK modulated signals.

The current-reused self-mixing voltage-controlled oscillator 112 of the invention utilizes a current-reused self-mixing technique to transmit radio frequency oscillator signals to a frequency doubler where double-frequency radio frequency signals are produced. Then, the double-frequency signals are subjected to frequency transfer by a cross coupling mixer of the current-reused self-mixing voltage-controlled oscillator 112 to become radio frequency signals with original frequency, which are then sent to an LC tank of the current-reused self-mixing voltage-controlled oscillator 112. This forms a positive feedback loop, which may enhance amplitude of output signals from the LC tank of the current-reused self-mixing voltage-controlled oscillator 112 and equivalently reduce phase noise of the output signals. In the above operation, the LC tank, the cross coupling mixer and the frequency doubler all use the current reuse technique to reduce consumption of required current and use the self-mixing technique to reduce phase noise of the output signals, such that larger oscillation signals can be outputted without increasing a bias current path.

The current-reused multiple-transconductance power amplifier 113 of the invention adopts a combination of DC block and transconductor to form such a multiple-transconductance amplifier. As power consumption of a power amplifier in a transmission process is relatively considerable, in the current-reused multiple-transconductance power amplifier 113 of the invention, the DC block serves as the ground for AC signals, and the transconductor can share a single DC path in a cascode manner to have bias, and further the DC block performs AC coupling so as to superimpose output AC signals, such that the multiple-transconductance effect is achieved and overall transconductance can be any multiple. This is significantly better than a conventional current reuse technique by which equivalent output transconductance (Gin) of a power amplifier is 2 times of Gin of a transistor.

During a current reuse process, if voltage swing of output signals is not large, there is no need to worry about transistor swing, thereby allowing an arbitrary multiple of transconductance to be achieved by any transistor cascode. In the current-reused multiple-transconductance power amplifier 113 of the invention, as input signals are differential signals and usually even harmonic components are in the same direction in a two-end output architecture, reverse differential signals in the invention can be superimposed in the same direction at an output end while even harmonic of the signals in the same direction would have reverse elimination. This thus accomplishes even harmonic elimination in an architecture using merely one bias current, which otherwise can only be achieved in a conventional differential power amplifier.

Figure 2A:
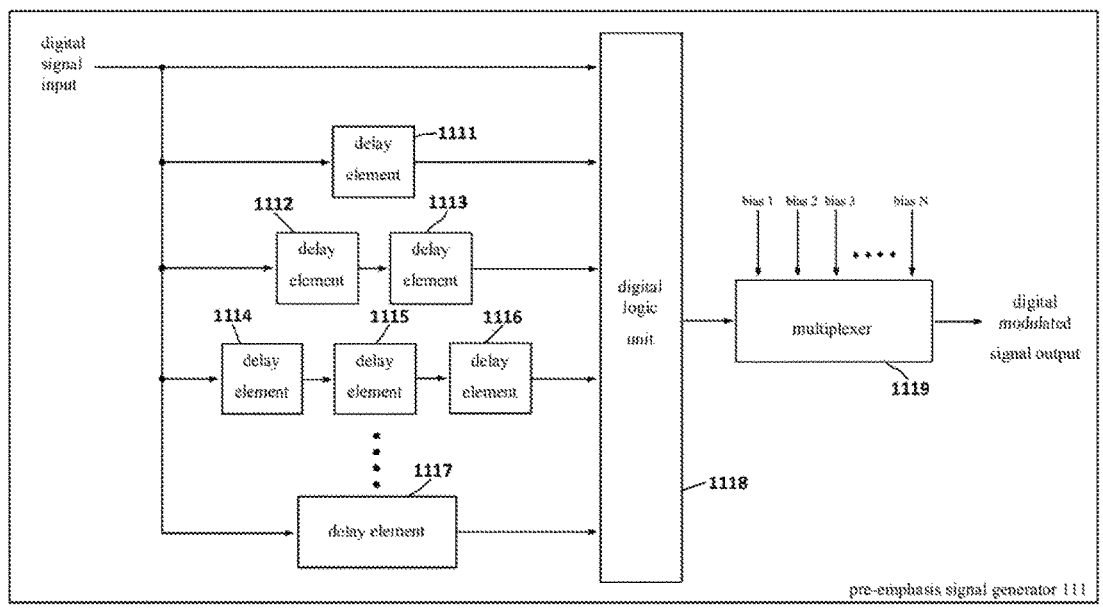
FIGS. 2A and 2B are respectively an internal architecture diagram and a circuit diagram of a pre-emphasis signal generator of the wireless radio frequency transceiver system of the invention.
Figure 2B:
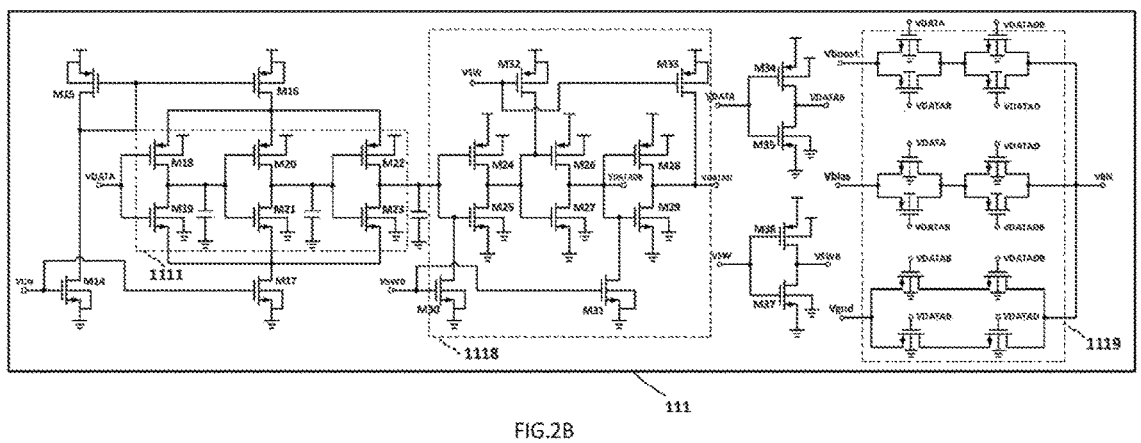

FIGS. 2A and 2B are respectively an internal architecture diagram and a circuit diagram of the pre-emphasis signal generator of the wireless radio frequency transceiver system of the invention. As shown in FIGS. 2A and 2B, the pre-emphasis signal generator 111 includes a plurality of delay elements 1111-1117, a digital logic unit 1118 and a multiplexer 1119, wherein digital signals are dispersed into different signals through the plurality of delay elements 1111-1117, and the different signals are calculated by the digital logic unit 1118 and then are processed by the multiplexer 1119 arranged with different voltage/current bias to form modulated output signals with different voltage/current amplitude.

Particularly, as the pre-emphasis signal generator 111 includes the plurality of delay elements 1111-1117, digital input signals are dispersed into different signals by different delay times and then are calculated by the digital logic unit 1118 to produce arbitrary digital modulation/coding waveform. This waveform as being subjected to digital circuit calculation includes only two types (0 and 1) of signal voltage/current amplitude. Then, the multiplexer 1119 (such as channel transistor logic multiplexer) performs selection of bias voltage/bias current to make output signals have different amplitude. This thereby makes the pre-emphasis signal generator 111 become an arbitrary waveform generator. The delay elements 1111-1117 can be in analog or digital form. The digital logic unit 1118 is used to execute various combinations of logic operations, for example, common logic operations AND, OR, NOT, XOR, NAND, NOR, XNOR, etc. The multiplexer 1119 can, via different input digital codes, select different bias voltage/current as output, so as to produce arbitrary waveform.

Figure 3A:
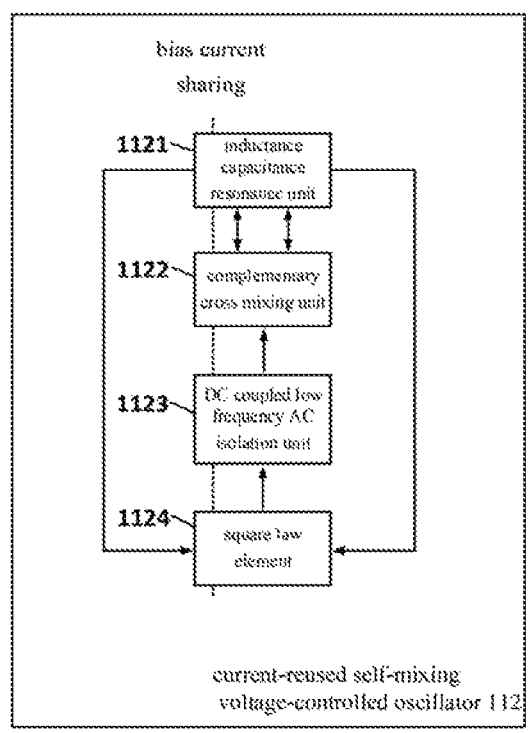
FIGS. 3A and 3B are respectively an internal architecture diagram and a circuit diagram of a current-reused self-mixing voltage-controlled oscillator of the wireless radio frequency transceiver system of the invention.
Figure 3B:
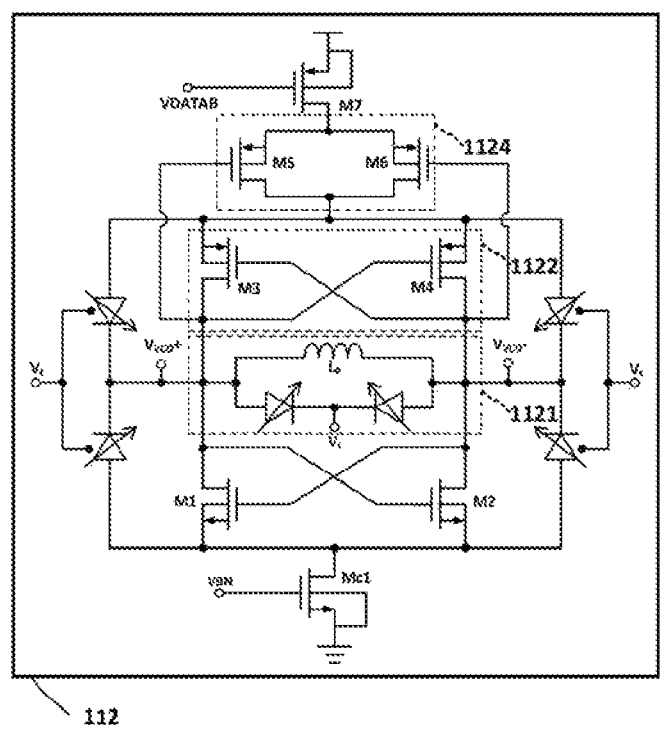

FIGS. 3A and 3B are respectively an internal architecture diagram and a circuit diagram of the current-reused self-mixing voltage-controlled oscillator of the wireless radio frequency transceiver system of the invention. As shown in FIGS. 3A and 3B, the current-reused self-mixing voltage-controlled oscillator 112 includes an inductance capacitance resonance unit 1121, a complementary cross mixing unit 1122, a DC coupled low frequency AC isolation unit 1123 and a square law element 1124. The square law element 1124 is used to perform frequency multiplication on the modulated output signals. The DC coupled low frequency AC isolation unit 1123 is used to filter the modulated output signals that have undergone frequency multiplication to remove low frequency noise therefrom. The complementary cross mixing unit 1122 is used to mix the filtered modulated output signals to down-convert them to a resonant frequency and send the signals back to the inductance capacitance resonance unit 1121. Thus, voltage/current amplitude of the modulated output signals can be enhanced through a positive feedback path.

Particularly, when the current-reused self-mixing voltage-controlled oscillator 112 starts oscillating, the inductance capacitance resonance unit 1121 with differential output would output resonant signals to the complementary cross mixing unit 1122 (frequency doubler) to produce double-frequency resonant signals that are then transmitted to the DC coupled low frequency AC isolation unit 1123 where low frequency filtering is performed. In order to prevent low frequency flicker noise from being sent to the complementary cross mixing unit 1122, the complementary cross mixing unit 1122 would up-convert the low frequency flicker noise to the resonant frequency and transmit it to the inductance capacitance resonance unit 1121, so as to interfere with output of the resonant signals and result in phase noise rise of the output resonant signals. After low frequency interference is filtered off by the DC coupled low frequency AC isolation unit 1123, the double-frequency resonant signals are sent to the complementary cross mixing unit 1122 where the double-frequency resonant signals are down-converted to the resonant frequency. By forming a positive feedback loop, output signals of the inductance capacitance resonance unit 1121 would have larger amplitude, thereby reducing phase noise of the output resonant signals.

The inductance capacitance resonance unit 1121 can be implemented by any type of active or passive capacitive components and inductive components, for example, LC network. The complementary cross mixing unit 1122 can be implemented by any circuit having a frequency modulation function and any circuit providing a negative resistance function, for example, cross coupled transistors. The DC coupled low frequency AC isolation unit 1123 can be implemented by any circuit architecture with DC feedthrough and a low frequency signal locking function. The square law element 1124 can be implemented by any circuit having an input signal frequency doubling function. Further, the inductance capacitance resonance unit 1121, the complementary cross mixing unit 1122, the DC coupled low frequency AC isolation unit 1123 and the square law element 1124 may all utilize a bias current/bias voltage reuse technique to share bias current/bias voltage and thereby reduce power consumption.

Figure 4A:
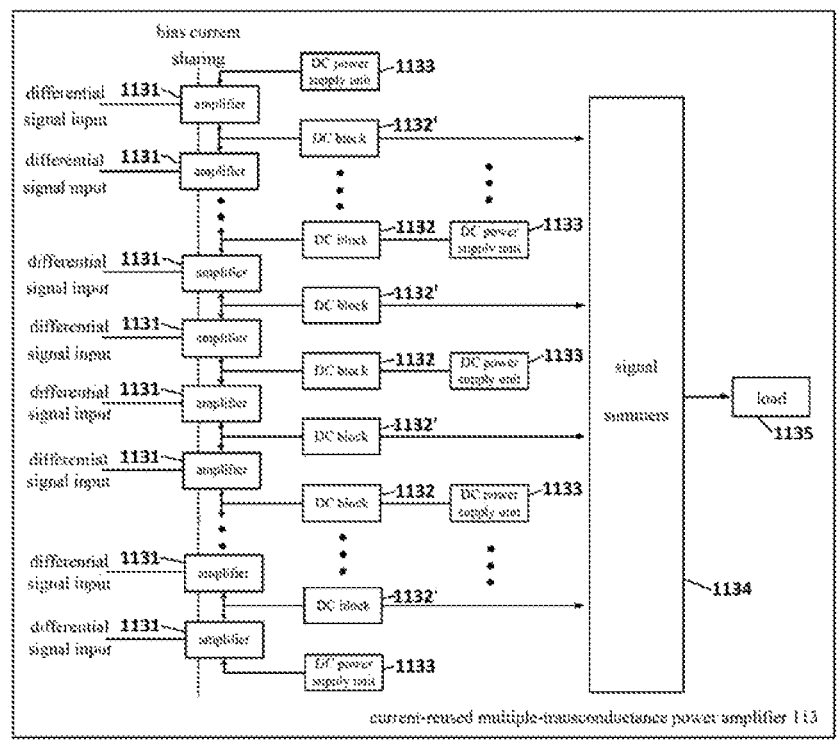
FIGS. 4A and 4B are respectively an internal architecture diagram and a circuit diagram of a current-reused multiple-transconductance power amplifier of the wireless radio frequency transceiver system of the invention.
Figure 4B:
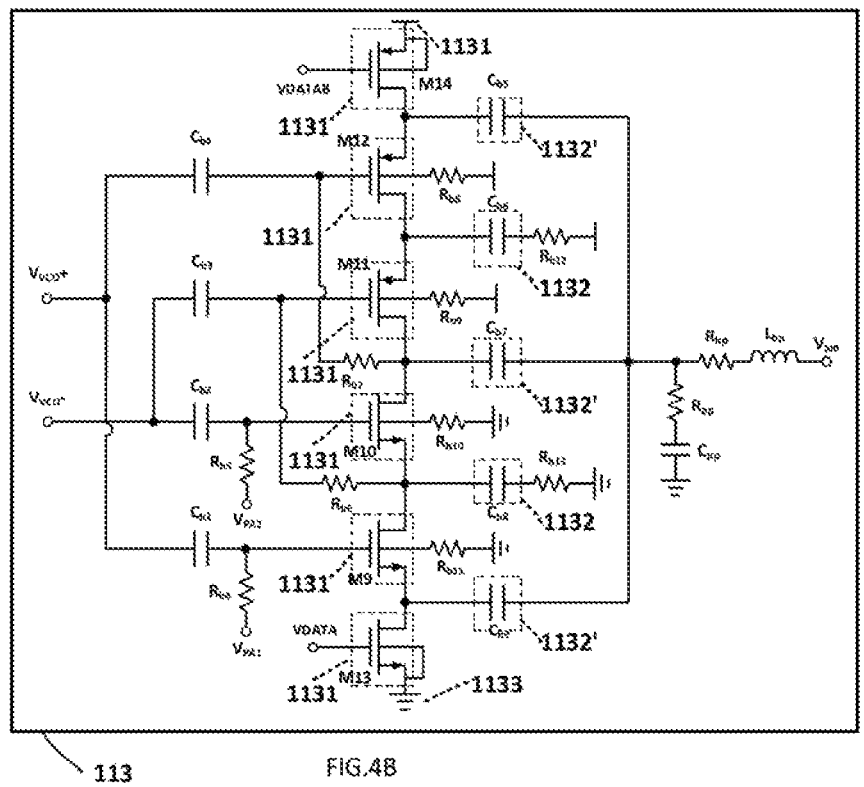

FIGS. 4A and 4B are respectively an internal architecture diagram and a circuit diagram of the current-reused multiple-transconductance power amplifier of the wireless radio frequency transceiver system of the invention. As shown in FIGS. 4A and 4B, the current-reused multiple-transconductance power amplifier 113 includes a plurality of amplifiers 1131, a plurality of DC blocks 1132, 1132', and a plurality of DC power supply units 1133. The DC blocks 1132, 1132' and the DC power supply units 1133 provide a loop for AC signals, and the plurality of amplifiers 1131 amplify voltage/current amplitude of the modulated output signals and send them to the output end, so as to achieve an arbitrary multiple of transconductance.

With the plurality of amplifiers 1131 and the plurality of DC blocks 1132 being be connected to the plurality of DC power supply units 1133, the current-reused multiple-transconductance power amplifier 113 can produce the arbitrary multiple of transconductance. First, differential input signals are inputted to each of the amplifiers 1131, and current/voltage signals amplified and outputted by the amplifiers 1131 are transmitted through the DC blocks 1132' to the output end where signal sum 1134 is performed and is finally outputted to load 1135. Moreover, all the amplifiers 1131 may share the same bias current/bias voltage, making the current-reused multiple-transconductance power amplifier 113 have lower power consumption but produce higher transconductance.

As in the current-reused multiple-transconductance power amplifier 113 the differential input signals would be superimposed in the same direction at the output end, input common mode noise or even harmonic signals in the same direction can have reverse elimination. Such a function can only be accomplished by a fully differential architecture in the conventional technology, while the current-reused multiple-transconductance power amplifier 113 of the invention, even though not a fully differential architecture, may have this function. The amplifiers 1131 can be implemented by any type of amplifiers, such as voltage amplifiers, current amplifiers, transconductance amplifiers or transimpedance amplifiers and so on. The DC blocks 1132, 1132' can be implemented by any circuit architecture that can block DC signals and transmit AC signals, such as active or passive inductance capacitance components.

The wireless radio frequency receiving module 12 of the invention utilizes a square law detection technique to complete signal demodulation. This technique involves a circuit component having a function of producing harmonic, such as a transistor component. After input signals being received are processed by the circuit component producing harmonic, baseband envelope signals and higher harmonic signals are generated. If the higher harmonic signals are filtered off by a harmonic filter (such as low-pass filter or band-pass filter), the left envelope signals are baseband signals that are what the wireless radio frequency receiving module 12 desires. This demodulation uses a small number of components only including a harmonic producing circuit and a harmonic filter component, and thus overall power consumption and chip area of the wireless radio frequency receiving module 12 are very low, thereby suitable for long term use and advantageously having low cost.

A receiver part of a conventional wireless radio frequency transceiver system usually adopts a high power mixer and a high power local oscillator to perform demodulation. However, if carrier frequency of input signals is not equal to that of the local oscillator, demodulated signals would have amplitude distortion and phase distortion. In order to prevent signal distortion, a phase-locked loop circuit must be added to the local oscillator of the receiver part and an oscillator of a transmitter part of the conventional wireless radio frequency transceiver system respectively to improve accuracy of the carrier frequency, while this would undesirably increase system power consumption. To address this problem, the invention proposes a new wireless radio frequency transceiver architecture that adopts a harmonic detection technique to accomplish signal demodulation. By this technique, even if carrier frequency of the received signals is offset, amplitude of demodulated signals being processed by the harmonic producing circuit and the harmonic filter component is not directly associated with the carrier frequency and thus is resistant to offset of the carrier frequency. Without adding any phase-locked loop circuit to the wireless radio frequency transmission module 11 and the wireless radio frequency receiving module 12, the entire wireless radio frequency transceiver system 1 may operate with even lower power consumption.

The wireless radio frequency receiving module 12 of the invention adopting the harmonic detection technique may demodulate input signals, and such demodulated signals directly fall on baseband, without having a problem of image interference encountered by conventional communication architecture. The conventional communication architecture, in order to solve the problem of image interference, needs a high-Q RF filter added to a front end of a wireless radio frequency receiver part thereof, thus undesirably increasing system power consumption, area and cost and reducing degree of integration. On the contrary, the invention does not have any problem of image interference and does not need any high-Q RF filter, thereby able to greatly reduce circuit area and cost, power consumption and complexity and also improve degree of system integration.

The wireless radio frequency receiving module 12 of the invention adopting the harmonic detection technique works the same as a conventional direct down-conversion receiving system in terms of directly down-converting signals to baseband. However such direct down-conversion makes the direct down-conversion receiving system confront a LO leakage self-mixing problem. This is because a local oscillator has very large signal amplitude while a mixer has limited isolation capacity, such that high frequency signals of the local oscillator would be fed through the mixer to an input end of the mixer, thereby causing self-mixing of the mixer and DC offset at an output end of the mixer. When DC offset and baseband signals (possibly having a DC part) mix together, interference with the baseband signals is caused, and system sensitivity and DC level of a back-end circuit are affected adversely. On the contrary, as the wireless radio frequency receiving module 12 of the invention adopts the harmonic detection technique, neither a local oscillator with large signals nor a mixer is needed, no LO leakage self-mixing problem is expected, and manufacture cost and power consumption can both be reduced.

In the balun self-biasing gain-bandwidth-improved envelope detector 121 of the invention, converting single-end signals into two-end signals can be implemented directly through a circuit architecture while there is no need to use a large area balun. As differential signal processing and signal transmission have a function of being resistant to common mode noise, a normal circuit design usually includes a fully differential circuit architecture for signal processing and transmission, and similarly, all circuit components in the wireless radio frequency receiving module 12 have a fully differential design. In a normal wireless radio frequency receiving system, as signals received by an antenna are single-end signals and thus a large area balun for converting these single-end signals into two-end signals is usually added to a front end of the receiving system, which operates with a mutual inductance characteristic to convert the signals from single-end into two-end. Such a balun due to its large area, if being integrated in an On-Chip manner, would overly increase the cost, so normally it is implemented in an Off-Chip manner. This however undesirably increases the overall system area and reduces degree of system integration. To address this problem, the wireless radio frequency receiving module 12 of the invention directly uses an On-Chip circuit architecture to convert single-end signals (that are received by the second antenna 14) into two-end signals, thereby greatly reducing system area and cost and improving degree of chip integration.

The balun self-biasing gain-bandwidth-improved envelope detector 121 of the invention has impedance matching at its input end to be able to achieve both maximum power match and best noise match. The balun self-biasing gainbandwidth-improved envelope detector 121 also has a reverse isolation function, making it have various functions and characteristics as a low-noise amplifier (LNA). It does not need a conventional large power LNA at a radio frequency front end thereof since a transmission distance of IOT is not long and input signals have relatively larger power, thereby advantageously reducing power consumption and area. Further with the impedance matching, the balun self-biasing gain-bandwidth-improved envelope detector 121 may act like a conventional inductive source degeneration LNA having a Q-boosting function for input cross voltage, said thus such a circuit can further have its gain being enhanced by Q times.

The wireless radio frequency receiving module 12 of the invention has transistors of various internal circuit components thereof operate in a weak-inversion region (or a subthreshold region). Compared to transistors operating in a strong-inversion region, under the same bias current the transistors operating in the weak-inversion region would have a larger value for small signal transconductance, making the wireless radio frequency receiving module 12 have further reduced system power consumption.

The balun self-biasing gain-bandwidth-improved envelope detector 121 of the invention adopts a self-biasing technique at its output end without the use of a common mode feedback circuit, thereby reducing circuit power consumption. One main drawback of using the harmonic detection demodulation technique is that signals after being demodulated all have low amplitude; in this case, output impedance of the balun self-biasing gain-bandwidth-improved envelope detector 121 must be decreased and so does its gain. In order to overcome the drawback of low output impedance caused by self-biasing, the invention proposes a self-biasing output-impedance-recovering technique in the balun self-biasing gain-bandwidth-improved envelope detector 121, which utilizes differential small signal virtual short circuit and common mode signal breaking characteristics to successfully achieve self-biasing at a circuit output end without reducing its output impedance. This is why the technique named "self-biasing output-impedance-recovering". This technique also omits circuit area and power consumption required by common mode feedback.

The balun self-biasing gain-bandwidth-improved envelope detector 121 of the invention also adopts a technique for both enhancing gain and bandwidth. When operating in the weak-inversion region, the envelope detector at its output end is very sensitive to parasitic capacitance. The parasitic capacitance may greatly affect bandwidth of signals demodulated by the envelope detector. If it is to have sufficiently large transconductance amplitude of the envelope detector, the output impedance must be enhanced. However, with the enhanced output impedance, RC time constant increases (R becomes larger) while bandwidth of output signals is reduced. Also to enhance the output impedance, in the same bias current and fixed output level, the length and width of transistors must be increased proportionally. This further raises the parasitic capacitance at the output end, making RC time constant further increase (C becomes larger) while further lowering the bandwidth, thereby adversely affecting the overall operating speed. In response, the balun self-biasing gain-bandwidth-improved envelope detector 121 of the invention utilizes a cascode self-biasing architecture, which has a cascode configuration of transistors to generate a larger output impedance value at the output end. Such a larger impedance value comes from the cascode configuration of transistors (having a characteristic of enlarging output impedance), such that a large transistor is not needed and the parasitic capacitance at the output end can be significantly reduced. This thus accomplishes an envelope detector architecture having high output impedance, high gain and broadband.

As described above, the balun self-biasing gain-bandwidth-improved envelope detector 121 uses the self-biasing output-impedance-recovering technique to connect two differential output ends together via extremely high impedance values. This also greatly speeds up output DC bias transient response and reduces output DC offset of the entire envelope detector. Improving the output transient response of the entire envelope detector significantly helps future integration of the wireless radio frequency receiving module 12 with a wake-up circuit. Adding a wake-up circuit is to control the wireless radio frequency receiving module 12 in a manner that, the wireless radio frequency receiving module 12 is turned on only when there is inputted a signal, while it is turned off if no signal is inputted, such that power consumption of the entire wireless radio frequency receiving module 12 can be further reduced. The wireless radio frequency receiving module 12 thus would be turned on or off frequently. If its DC transient response is too slow, it means time for turning it on and off is too long, thus reducing signal bit rate of the entire awaked wireless radio frequency receiving module 12 and reducing the amount of data transmission. Accordingly, speeding up DC transient response is deemed necessary, and the invention adopts the self-biasing output-impedance-recovering technique to improve DC level transient response and thereby successfully enhance system bit rate. Moreover, the self-biasing output-impedance-recovering technique has another function of reducing DC offset of the differential output ends. As the output ends are connected together by two circuits with extremely large impedance values, these two circuits would average DC levels of the output ends in a manner of making the DC levels of the two output ends toward a center value (an average value), so as to reduce DC offset at the output ends. If there is DC offset at an output end, the DC offset would be amplified by a next stage amplifier, resulting in DC level saturation at an output end of the amplifier, and thus losing the ability to detect signals. The invention utilizing the self-biasing output-impedance-recovering technique may undoubtedly solve the DC level offset problem at differential output ends.

The balun self-biasing gain-bandwidth-improved envelope detector 121 of the invention is provided at its back end with a tunable high-pass filter 122. The wireless radio frequency receiving module 12 adopts the harmonic detection technique to demodulate signals, and the demodulated signals are directly down-converted to baseband. This technique advantageously does not need a large power mixer and a large power oscillator for demodulation, but having the demodulated signals directly down-converted to baseband makes them prone to direct flicker noise interference. Such extremely low frequency interference has very large amplitude, and after being amplified by a later stage amplifier, it definitely causes DC offset at an output end of the amplifier and thus makes a next stage baseband amplifier malfunction. The tunable high-pass filter 122 added to the back end of the balun self-biasing gain-bandwidth-improved envelope detector 121 of the invention may filter off low frequency interference from the demodulated baseband signals to prevent the low frequency interference from being passed to the next stage baseband amplifier and thus avoid DC level saturation of a back-end circuit.

Further, the balun self-biasing gain-bandwidth-improved envelope detector 121 of the invention addresses the problem of output signal mismatch of a conventional differential output envelope detector. A conventional harmonic detection envelope detector, if to generate differential output signals and incorporate a current reuse technique, can only have a circuit design of having a lower output end using a N-type transistor for outputting signals and an upper output end using a P-type transistor for outputting signals. This design however would lead to the N-type and P-type transistors having different doping concentration if there is process offset, thereby further causing mismatch between carrier mobility and channel threshold voltage (Vth) of the N-type and P-type transistors. Accordingly, output signals at the two ends must have different amplitude, and two differential signals having different output amplitude if being sent to a next stage differential circuit would adversely affect operation and efficacy of the next stage circuit. The balun self-biasing gain-bandwidth-improved envelope detector 121 of the invention allows differential signal output ends to both use N transistor loads or both use P transistor loads for demodulation, thereby solving the problem of output signal mismatch of the conventional differential output envelope detector.

The balun self-biasing gain-bandwidth-improved envelope detector 121 of the invention incorporates a coupling capacitor. As signals demodulated by the envelope detector are directly converted to baseband, the baseband signals would definitely mix with the component's own low frequency flicker noise, thereby lowering sensitivity of the entire wireless radio frequency receiving module 12. Accordingly, adding a low frequency block in the invention makes the envelope detector itself have a function of filtering off low frequency noise and can address the problem of low frequency noise interference.

The current-reused cascode-two-stage amplifier 123 of the invention adopts a current reuse technique to accomplish a two-stage amplifier that only uses a single bias current (a conventional two-stage amplifier needs two or more bias currents). As demodulated output baseband signals from the balun self-biasing gain-bandwidth-improved envelope detector 121 have very small amplitude, if they are directly sent to the comparator 124, the comparator 124 is not able to latch such signals having very small amplitude. Thus before being sent to the comparator 124, a baseband amplifier is utilized to amplify the demodulated signals to the magnitude that can be latched by the comparator 124. Normally an amplifier adopts a negative feedback architecture in order to amplify signals without distortion, but gain would be reduced by negative feedback. The invention performs digital modulation and demodulation and merely transmits 0 and 1 digital modulation signals. Even if there is signal distortion, the comparator 124 still can convert input signals into 0 and 1 digital output signals as long as they have large enough amplitude. The current-reused cascode-two-stage amplifier 123 of the invention adopts an open loop architecture design, which can improve the gain and allow the wireless radio frequency receiving module 12 with even lower power consumption to have greater gain.

The current-reused cascode-two-stage amplifier 123 of the invention uses a circuit internal cross wiring design, which makes such a cascode amplifier, irrespective of traditional amplifier architecture specifications, have advantages of lower power consumption and better bandwidth of a baseband amplifier and also have advantages of higher gain and larger output swing of a two-stage amplifier, so as to create a baseband amplifier with low power consumption, great bandwidth and high gain.

The current-reused cascode-two-stage amplifier 123 of the invention using the circuit internal cross wiring design has a characteristic of internal positive feedback. The positive feedback effect changes gain of the baseband amplifier, making the overall gain increased by 1/(1−BA) times after feedback, wherein A is amplifier's original gain, and B is a feedback factor. If feedback loop gain (BA) is set as a value smaller than 1, the wireless radio frequency receiving module 12 can remain stable even if there is a positive feedback mechanism.

The current-reused cascode-two-stage amplifier 123 of the invention using the circuit internal cross wiring design has a function of self-biasing correction for output end DC level. Thus its two differential output ends do not need a common mode feedback circuit for stabilizing output DC level, such that design and power consumption required for the use of a common mode feedback circuit should not be considered.

The current-reused cascode-two-stage amplifier 123 of the invention adopts a weak-inversion technique, which not only further reduces power consumption of the amplifier, but also significantly reduces the feedback factor B to an extremely low value (B value is equal to reciprocal of transistor output impedance on a feedback path) since the transistor output impedance is very high in the weak-inversion region. This makes BA value very easily set to be smaller than 1, and thus stabilizes the wireless radio frequency receiving module 12.

Figure 5A:
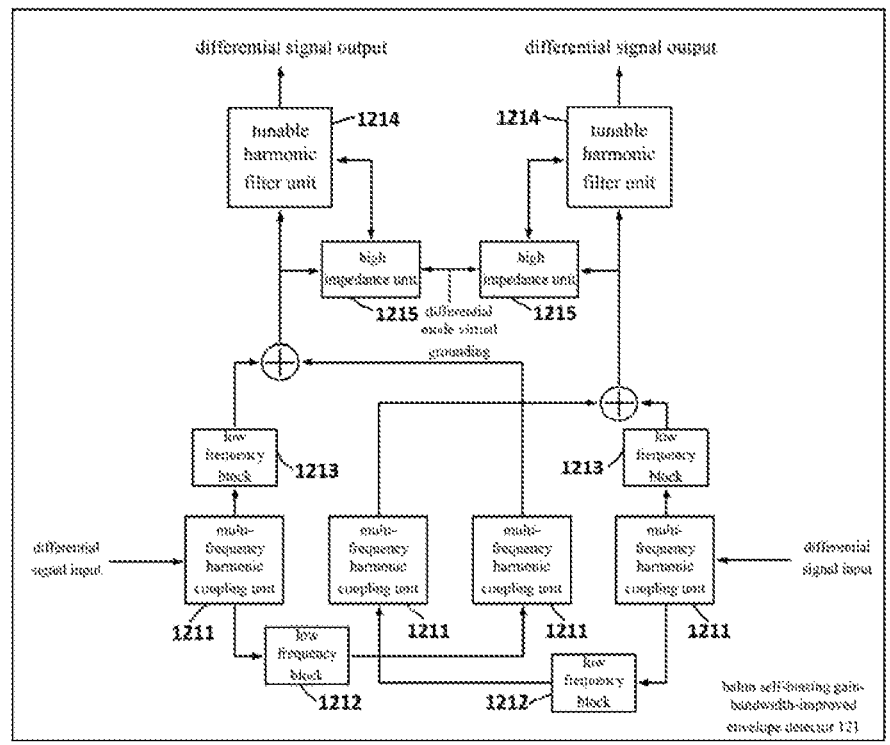
FIGS. 5A and 5B are respectively an internal architecture diagram and a circuit diagram of a balun self-biasing gain-bandwidth-improved envelope detector of the wireless radio frequency transceiver system of the invention.
Figure 5B:
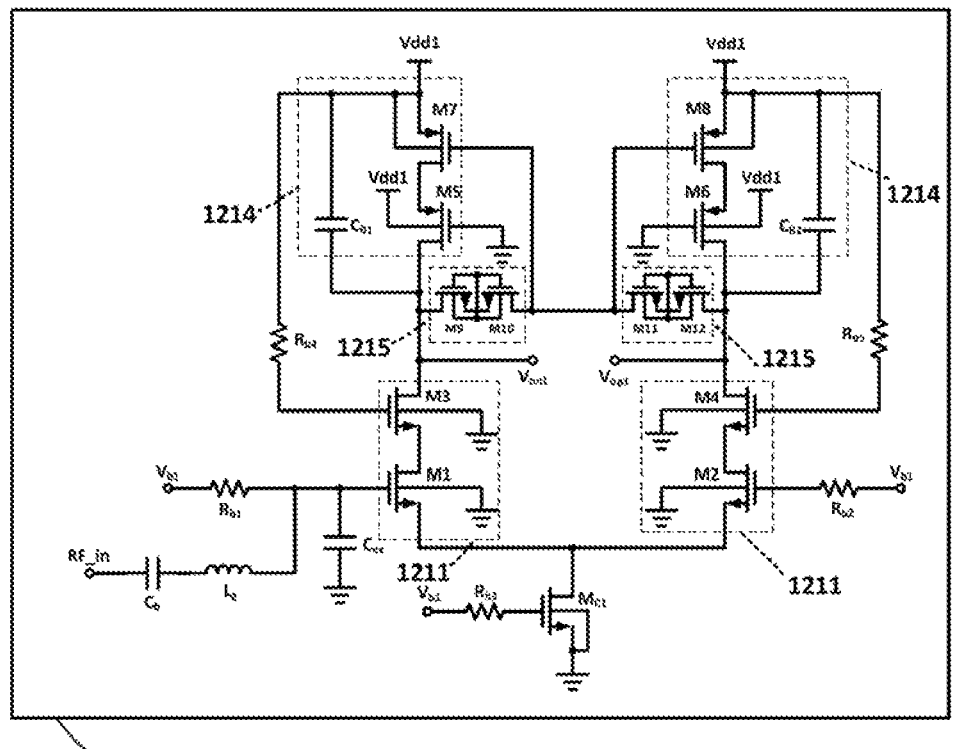

FIGS. 5A and 5B are respectively an internal architecture diagram and a circuit diagram of the balun self-biasing gain-bandwidth-improved envelope detector of the wireless radio frequency transceiver system of the invention. As shown in FIGS. 5A and 5B, the balun self-biasing gain-bandwidth-improved envelope detector 121 includes multi-frequency harmonic coupling units 1211, low frequency blocks 1212, 1213, tunable harmonic filter units 1214 and high impedance units 1215. The multi-frequency harmonic coupling units 1211 receive and process carrier input signals to produce harmonic distortion signals. The low frequency blocks 1212, 1213 filter the harmonic distortion signals to remove low frequency noise interference and send the filtered harmonic distortion signals to the tunable harmonic filter unit 1214. The tunable harmonic filter units 1214 filter out baseband signals from the filtered harmonic distortion signals. The high impedance units 1215 enhance output impedance at the output end via an AC signal virtual grounding characteristic.

Particularly, input signals can be single-end or two-end signals. For single-end input, there is no need of input signals at the other end where DC bias voltage/current can be directly provided. First, the multi-frequency harmonic coupling units 1211 process input differential signals to form harmonic distortion signals that contain demodulated baseband signals. Then, the harmonic distortion signals are transmitted downwardly and upwardly to the low frequency blocks 1212 and the low frequency blocks 1213 respectively where low frequency flicker noise can be filtered off. After filtering, the signals are sent to the tunable harmonic filter units 1214 to filter out the desired baseband signals. The high impedance units 1215 may enhance output impedance at the output end and thus increase gain of the entire envelope detector.

The multi-frequency harmonic coupling units 1211 can be implemented by any harmonic producing circuit component or architecture. The low frequency blocks 1212, 1213 can be implemented by any low frequency blocking circuit architecture, such as inductance capacitance resistance component. The high impedance units 1215 can be implemented by any high impedance circuit component or architecture, such as passive resistor or active transistor resistor. The tunable harmonic filter units 1214 can be implemented by any high frequency harmonic filtering circuit component or architecture, such as passive component filter or active component filter. Moreover in FIG. 5A, a single bias current or bias voltage may apply to the first and third left multi-frequency harmonic coupling units 1211 and the left low frequency blocks 1212, 1213, tunable harmonic filter unit 1214 and high impedance unit 1215. Similarly, another single bias current or bias voltage may apply to the other half of the components. Such voltage/current sharing can further reduce power consumption.

Figure 6:
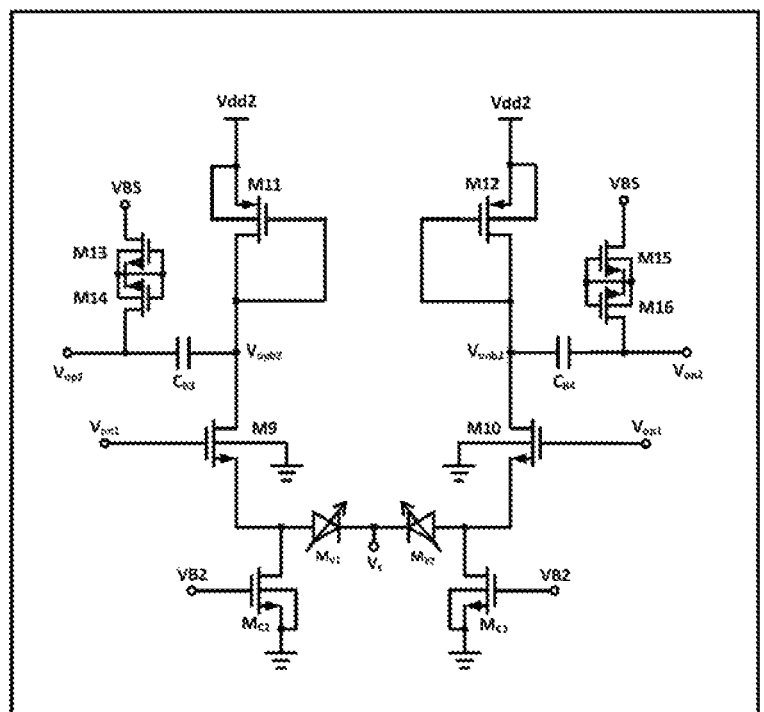
FIG. 6 is a circuit diagram of a tunable high-pass filter in a wireless radio frequency receiving module of the wireless radio frequency transceiver system of the invention.

FIG. 6 is a circuit diagram of the tunable high-pass filter in the wireless radio frequency receiving module of the wireless radio frequency transceiver system of the invention. As shown in FIG. 6, the tunable high-pass filter 122 of the invention adopts an AC signal virtual grounding characteristic and combines source degeneration and variable capacitance of source of transistors to form such a tunable high-pass filter for filtering off low frequency interference. As the demodulated signals directly fall on baseband and have extremely small amplitude, they would mix with low frequency noise. This, after being amplified by a later stage amplifier, would definitely lead to output end saturation of the amplifier. The receiving module of the invention allows low frequency interference to be filtered off from the demodulated signals by a high-pass filter. This high-pass filter circuit adopts a combination of source degeneration and variable capacitance to form such a low power consumption tunable high-pass filter 122.

Figure 7A:
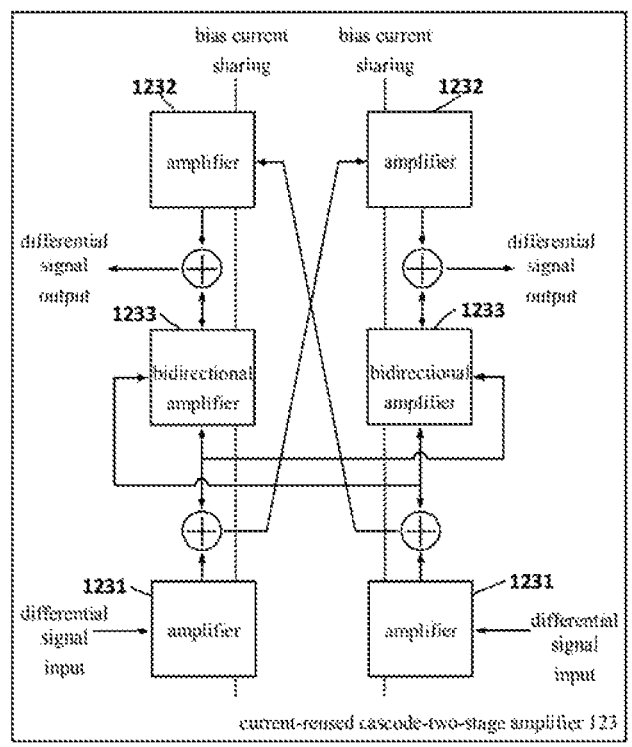
FIGS. 7A and 7B are respectively an internal architecture diagram and a circuit diagram of a current-reused cascode-two-stage amplifier of the wireless radio frequency transceiver system of the invention.
Figure 7B:
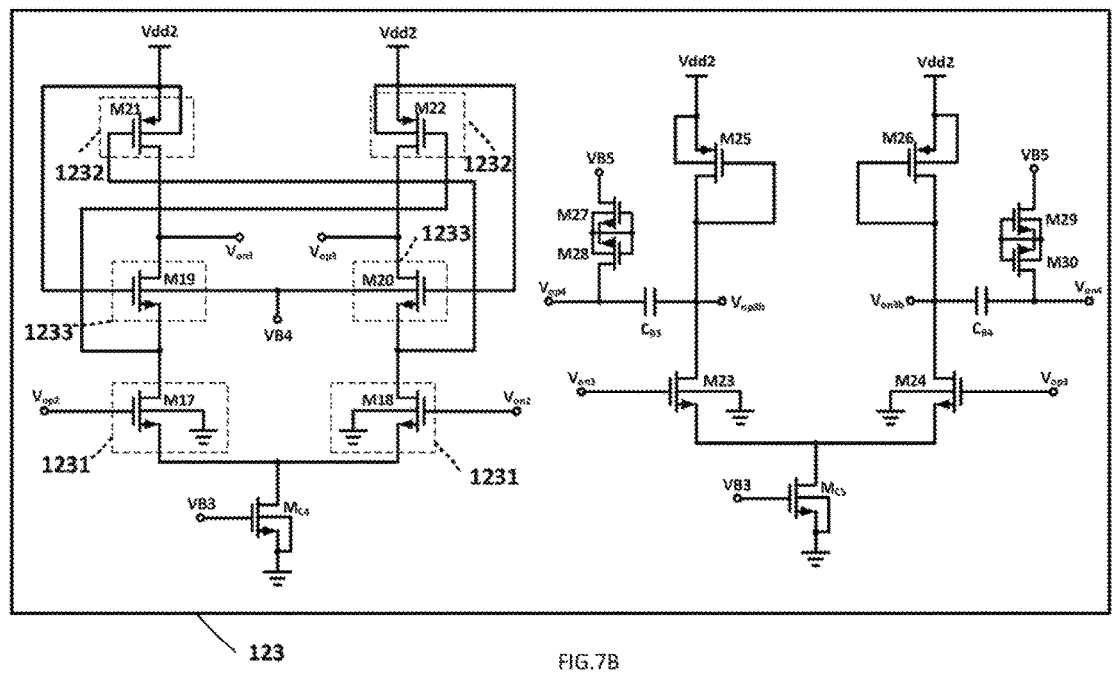

FIGS. 7A and 7B are respectively an internal architecture diagram and a circuit diagram of the current-reused cascode-two-stage amplifier of the wireless radio frequency transceiver system of the invention. As shown in FIGS. 7A and 7B, the current-reused cascode-two-stage amplifier 123 includes a plurality of amplifiers 1231, 1232 and bidirectional amplifiers 1233. The plurality of amplifiers 1231, 1232 are crossly wired. The demodulated differential signals are amplified by the plurality of amplifiers 1231, 1232 and then sent to the output end. The bidirectional amplifiers 1233 enhance amplitude of output signals via a dual input signal reused characteristic.

In operation, input differential signals are first sent to the amplifiers 1231 for amplification, then are sent to the amplifiers 1232 where second amplification is performed, and finally are sent to the output end. The entire architecture acts as a two-stage amplifier by which several times of amplification are executed during the process of amplification. The bidirectional amplifiers 1233 make use of the dual input signal reused characteristic to further enhance amplitude of the output signals. And, the bidirectional amplifiers 1233 are connected between first stage amplifiers and second stage amplifiers to thereby form a positive feedback network, making gain of the current-reused cascode-two-stage amplifier 123 increased by 1/(1−BA) times. By a positive feedback path of the bidirectional amplifiers 1233 and with different types of the bidirectional amplifiers 1233 (for example, voltage amplifier, current amplifier, transconductance amplifier or transimpedance amplifier, etc.), output impedance amplitude of the first stage and second stage amplifiers can be arbitrarily increased or decreased so as to vary the overall bandwidth or gain or stability phase margin of the current-reused cascode-two-stage amplifier 123. Moreover, the current-reused cascode-two-stage amplifier 123 has a cross wiring architecture and accordingly has a function of output end DC level self-stabilization, thereby neither using a common mode feedback circuit nor sustaining power consumption required for the common mode feedback circuit. The amplifiers 1231, 1232 and the bidirectional amplifiers 1233 can be implemented by any amplifier architecture or component, such as voltage amplifier, current amplifier, transconductance amplifier or transimpedance amplifier, and so on.

Figure 8:
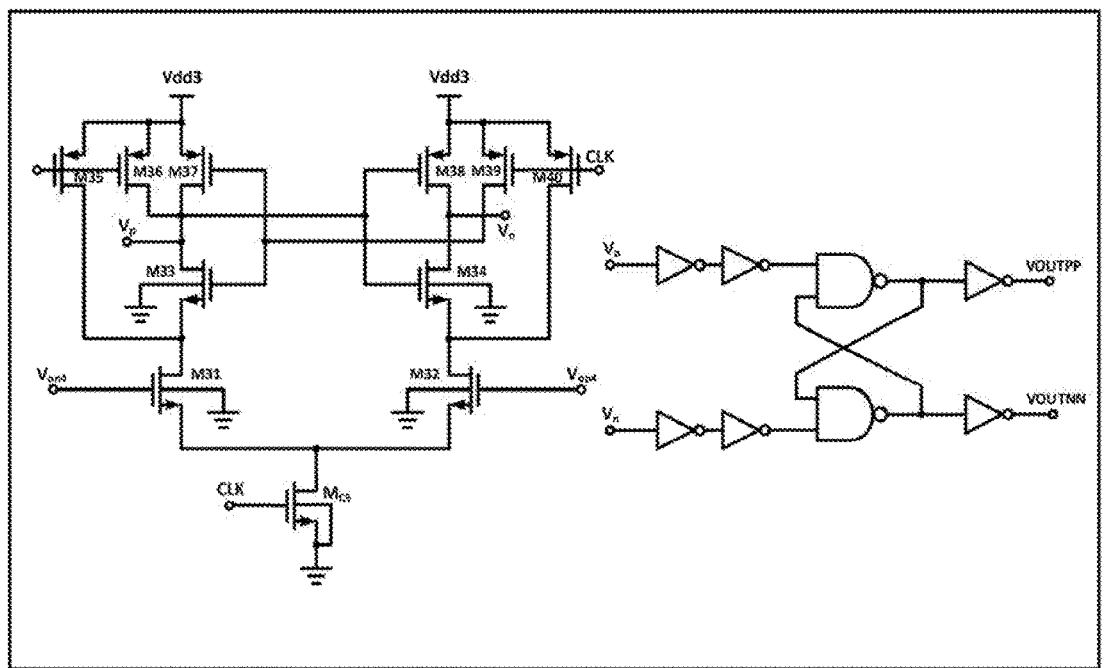
FIG. 8 is a circuit diagram of a comparator in the wireless radio frequency receiving module of the wireless radio frequency transceiver system of the invention.

FIG. 8 is a circuit diagram of the comparator in the wireless radio frequency receiving module of the wireless radio frequency transceiver system of the invention. In the wireless radio frequency receiving module 12, first, signals are demodulated by the balun self-biasing gain-bandwidth-improved envelope detector 121; then, the demodulated signals are amplified by the current-reused cascode-two-stage amplifier 123 to certain amplitude; and finally, the comparator 124 performs conversion and output of digital signals in a non-linear amplification manner that converts baseband signals into Rail-to-Rail digital signals. Compared to using a high-gain operational amplifier, the use of a baseband amplifier for amplification and the comparator 124 having a latch function may achieve even lower power consumption and output more ideal digital signals. The latch can have single-level or multi-level detection, such as two-level latch for Schmitt Trigger.

The wireless radio frequency transceiver system proposed in the invention has a wireless radio frequency receiving module that utilizes a harmonic detection technique to perform demodulation. This can significant simplify complexity of the wireless radio frequency receiving module, reduce system power consumption and area, and thereby facilitate integration. Moreover, as the wireless radio frequency receiving module utilizes the harmonic detection technique, there is no need to use a phase-locked loop in a wireless radio frequency transmission module of the wireless radio frequency transceiver system, thereby desirably simplifying system design, reducing power consumption and area and facilitating integration.

Therefore, the wireless radio frequency transmission module of the invention includes: a pre-emphasis signal generator, a current-reused self-mixing voltage-controlled oscillator, and a current-reused multiple-transconductance power amplifier. The pre-emphasis signal generator is used to perform shaping of signal waveform, which can be done in various ways to compensate possible shortcomings of different modulation methods. This not only solves a problem of slow amplitude change of OOK signals and ASK signals, but also speeds up stability of frequency modulation of FSK signals as well as solves a high-frequency interference problem of discontinuous PSK signals. The current-reused self-mixing voltage-controlled oscillator utilizes a self-mixing technique, making it operate with lower power consumption, component area and cost while output signals having larger voltage/current amplitude and lower phase noise and lower noise skin, thereby reducing interference of the wireless radio frequency transmission module with other frequency bands. The current-reused multiple-transconductance power amplifier adopts a current reuse technique, an amplifier cascode architecture and a DC block to form a power amplifier that can produce an arbitrary multiple of transconductance, so as to output higher output power to a transmission antenna under lower power consumption, such that the use of the power amplifier may achieve higher energy conversion benefits. The amplifier cascode architecture can simply use a single bias current to accomplish even harmonic elimination function and common mode noise elimination function that usually are only possessed by differential architecture. This improves linearity of the output signals, reduces interference with neighbor channels, improves signal-to-noise ratio (SNR) of a wireless radio frequency receiving module of the invention, and reduces bit-error rate of the wireless radio frequency receiving module.

The wireless radio frequency receiving module of the invention includes: a balun self-biasing gain-bandwidth-improved envelope detector, a tunable high-pass filter, a current-reused cascode-two-stage amplifier and a comparator. The balun self-biasing gain-bandwidth-improved envelope detector detects baseband envelope parts from input signals, and converts the baseband envelope parts into differential signals for being outputted. The tunable high-pass filter may eliminate a problem that signals demodulated by the envelope detector directly fall on baseband and are subjected to low frequency flicker noise interference. The current-reused cascode-two-stage amplifier has advantages of a cascode amplifier: lower power consumption and better bandwidth and of a two-stage amplifier: better gain and larger output swing. The comparator converts signals into digital data for being processed and displayed by a back-end device. If analog signals are transmitted, they are not sent to the comparator but are directly outputted by the amplifier.

The examples above are only illustrative to explain principles and effects of the invention, but not to limit the invention. It will be apparent to those skilled in the art that modifications and variations can be made without departing from the spirit and scope of the invention. Therefore, the protection range of the rights of the invention should be as defined by the appended claims.

What is claimed is:

1. A wireless radio frequency transceiver system for Internet of Things, including:
   a wireless radio frequency transmission module including:
      a pre-emphasis signal generator for shaping signal waveform of digital signals from the Internet of Things to modulate the digital signals to form modulated output signals;
      a current-reused self-mixing voltage-controlled oscillator for increasing voltage/current amplitude of the modulated output signals and reducing phase noise via a self-mixing technique; and
      a current-reused multiple-transconductance power amplifier for amplifying the voltage/current amplitude of the modulated output signals via a current reuse technique, and transmitting the amplified modulated output signals through a first antenna to a wireless channel; and
   a wireless radio frequency receiving module including:
      a balun self-biasing gain-bandwidth-improved envelope detector for detecting carrier input signals received from a second antenna to obtain baseband signals and demodulating the baseband signals to form differential signals; and
      a current-reused cascode-two-stage amplifier for amplifying voltage/current amplitude of the demodulated differential signals several times in an open loop state to produce output signals, and transmitting the output signals to a back-end signal processor.

2. The wireless radio frequency transceiver system according to claim 1, wherein the wireless radio frequency receiving module further includes a tunable high-pass filter for filtering off low frequency noise from the demodulated differential signals.

3. The wireless radio frequency transceiver system according to claim 1, wherein the wireless radio frequency receiving module further includes a comparator for detecting the output signals amplified by the current-reused cascode-two-stage amplifier, converting the output signals into digital data, and transmitting the digital data to the signal processor where the digital data are processed and displayed.

4. The wireless radio frequency transceiver system according to claim 1, wherein if the differential signals are analog signals, the output signals amplified by the current-reused cascode-two-stage amplifier are outputted directly.

5. The wireless radio frequency transceiver system according to claim 1, wherein the pre-emphasis signal generator includes a plurality of delay elements, a digital logic unit and a multiplexer, wherein the digital signals are dispersed into different signals by the plurality of delay elements, and the different signals are calculated by the digital logic unit and are processed by the multiplexer arranged with different voltage/current bias to form the modulated output signals with different voltage/current amplitude.

6. The wireless radio frequency transceiver system according to claim 1, wherein the current-reused self-mixing voltage-controlled oscillator includes a square law element, a direct current (DC) coupled low frequency alternating current (AC) isolation unit, a complementary cross mixing unit and an inductance capacitance resonance unit, wherein the square law element performs frequency multiplication on the modulated output signals, the DC coupled low frequency AC isolation unit filters the modulated output signals that have been subjected to frequency multiplication to remove low frequency noise therefrom, and the complementary cross mixing unit mixes the filtered modulated output signals to down-convert them to a resonant frequency and sends them back to the inductance capacitance resonance unit, so as to enhance voltage/current amplitude of the modulated output signals through a positive feedback path.

7. The wireless radio frequency transceiver system according to claim 1, wherein the current-reused multiple-transconductance power amplifier includes a plurality of amplifiers, direct current (DC) blocks, DC power supply units and signal summers, wherein the DC blocks and the DC power supply units provide a loop for AC signals, and the plurality of amplifiers amplify voltage/current amplitude of the modulated through the DC blocks to output signals and send them to an output end for signal summation of the output signals by the signal summers, so as to achieve an arbitrary multiple of transconductance gain and to produce a higher transconductance gain.

8. The wireless radio frequency transceiver system according to claim 1, wherein the balun self-biasing gain-bandwidth-improved envelope detector includes multi-frequency harmonic coupling units, low frequency blocks, tunable harmonic filter units and high impedance units, wherein the multi-frequency harmonic coupling units receive and process the carrier input signals to produce harmonic distortion signals, the low frequency blocks filter the harmonic distortion signals to remove low frequency noise interference and send the filtered harmonic distortion signals to the tunable harmonic filter unit, the tunable harmonic filter units filter out baseband signals from the filtered harmonic distortion signals, and the high impedance units enhance output impedance at an output end via an alternating current (AC) signal virtual grounding characteristic.

9. The wireless radio frequency transceiver system according to claim 1, wherein the current-reused cascodetwo-stage amplifier includes a plurality of amplifiers and bidirectional amplifiers, wherein the plurality of amplifiers are crossly wired, the demodulated differential signals are amplified by the plurality of amplifiers and are sent to an output end, and the bidirectional amplifiers enhance amplitude of the output signals via a dual input signal reused characteristic.

* * * * *